United States Patent
Bentley et al.

(10) Patent No.: US 10,446,659 B2
(45) Date of Patent: Oct. 15, 2019

(54) NEGATIVE CAPACITANCE INTEGRATION THROUGH A GATE CONTACT

(71) Applicant: GLOBALFOUNDRIES INC., Grand Cayman (KY)

(72) Inventors: Steven Bentley, Menands, NY (US); Rohit Galatage, Clifton Park, NY (US); Puneet Harischandra Suvarna, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 98 days.

(21) Appl. No.: 15/783,270

(22) Filed: Oct. 13, 2017

(65) Prior Publication Data

US 2019/0115444 A1    Apr. 18, 2019

(51) Int. Cl.
| | |
|---|---|
| *H01L 29/51* | (2006.01) |
| *H01L 29/49* | (2006.01) |
| *H01L 21/28* | (2006.01) |
| *H01L 23/535* | (2006.01) |
| *H01L 29/66* | (2006.01) |
| *H01L 29/78* | (2006.01) |
| *H01L 21/768* | (2006.01) |

(52) U.S. Cl.
CPC ...... *H01L 29/516* (2013.01); *H01L 21/28079* (2013.01); *H01L 23/535* (2013.01); *H01L 29/495* (2013.01); *H01L 29/66545* (2013.01); *H01L 29/66795* (2013.01); *H01L 29/785* (2013.01); *H01L 29/7851* (2013.01); *H01L 21/76802* (2013.01); *H01L 21/76843* (2013.01); *H01L 21/76877* (2013.01)

(58) Field of Classification Search
CPC ............... H01L 29/516; H01L 29/7851; H01L 29/66545; H01L 23/535; H01L 21/28079; H01L 29/495; H01L 29/66795; H01L 21/76843; H01L 21/76802; H01L 21/76877; H01L 29/785
See application file for complete search history.

(56) References Cited

U.S. PATENT DOCUMENTS

| 9,722,093 B1* | 8/2017 | Xing ................... H01L 29/7869 |
| 2014/0264632 A1* | 9/2014 | Richter ............ H01L 29/66795 257/401 |
| 2018/0226415 A1* | 8/2018 | Ando ................ H01L 27/11507 |

OTHER PUBLICATIONS

Kai-Shin Li, et al., "Sub 60mV—Swing Negative-Capacitance FinFET without Hysteresis"; Electron Devices Meeting (IEDM) 2015 IEEE International; Dec. 7-9, 2015.

* cited by examiner

*Primary Examiner* — William F Kraig
*Assistant Examiner* — Vicki B. Booker
(74) *Attorney, Agent, or Firm* — David Cain; Hoffman Warnick LLC

(57) ABSTRACT

A layer of ferroelectric material is incorporated into the gate contact of a metal oxide semiconductor field effect transistor (MOSFET), i.e., outside of the device active area. Flexibility in the deposition and patterning of the ferroelectric layer geometry allows for efficient matching between the capacitance of the ferroelectric layer and the capacitance of the gate, providing a step-up voltage transformer, decreased threshold voltage, and a sub-threshold swing for the device of less than 60 mV/decade.

16 Claims, 13 Drawing Sheets

NEGATIVE CAPACITANCE INTEGRATION THROUGH A GATE CONTACT

BACKGROUND

The present application relates generally to semiconductor devices, and more specifically to negative capacitance devices such as negative capacitance field effect transistors and their methods of manufacture.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped over the top and the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture. Conductive contacts to each of the gate, source, and drain regions of the device are formed by deposition of one or more metal layers.

SUMMARY

Notwithstanding recent developments, there is a need for improved electrostatic control of such devices, including the formation of devices having a lower off-state current and/or threshold voltage and a corresponding decrease in heat generated during switching.

The phenomenon of effective negative permittivity exhibited by ferroelectric materials has led to Applicant's observation that the incorporation of a layer of ferroelectric material adjacent to the gate contact of a metal oxide semiconductor field effect transistor (MOSFET) can advantageously decrease the sub-threshold swing (S) of the device. The sub-threshold swing is defined as the change in gate voltage that must be applied in order to create a one decade increase in the output current.

According to various embodiments, for a FinFET having a ferroelectric layer located between the gate contact and the gate conductor, the channel potential of the device during operation can change more than the gate voltage, thus providing a step-up voltage transformer and S<60 mV/decade. Such a structure can exhibit a decreased off-state current ($I_{off}$) and/or threshold voltage ($V_t$), which enable further device scaling by decreasing the amount of heat generated during switching. In addition to decreasing the threshold voltage, the disclosed negative capacitance FETs enable a decrease in the supply voltage ($V_{DD}$), thereby saving power. Applicant has demonstrated that the internal voltage gain and the attendant steep sub-threshold swing improve performance in both p-type field effect transistors (PFETs) and n-type field effect transistors (NFETs).

In comparative devices, the absence of adequate capacitance matching between the ferroelectric layer and the gate dielectric has been a barrier to realizing the benefits of the negative capacitance effect. Incorporation of the ferroelectric layer within the gate contact architecture, e.g., outside of the device active area, enables flexible tuning of the geometry and hence the capacitance of the ferroelectric layer, which provides improved capacitance matching and improved device performance. Extending the gate contact outside of the device active area may enable further geometric tuning.

In accordance with various embodiments, a semiconductor device includes a gate disposed over an active area of a semiconductor substrate, where the gate extends laterally over the semiconductor substrate outside of the active area. A gate contact is disposed over the gate outside of the active area, and a ferroelectric layer is disposed between the gate contact and the gate. A semiconductor device may also include a gate disposed over an active area of a semiconductor substrate, a gate contact disposed over the gate, and a ferroelectric layer disposed between the gate contact and the gate.

According to further embodiments, a method of fabricating a semiconductor device includes forming a gate over an active area of a semiconductor substrate, wherein the gate extends laterally over the semiconductor substrate outside of the active area, forming a ferroelectric layer over the gate outside of the active area, and forming a gate contact over the ferroelectric layer.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
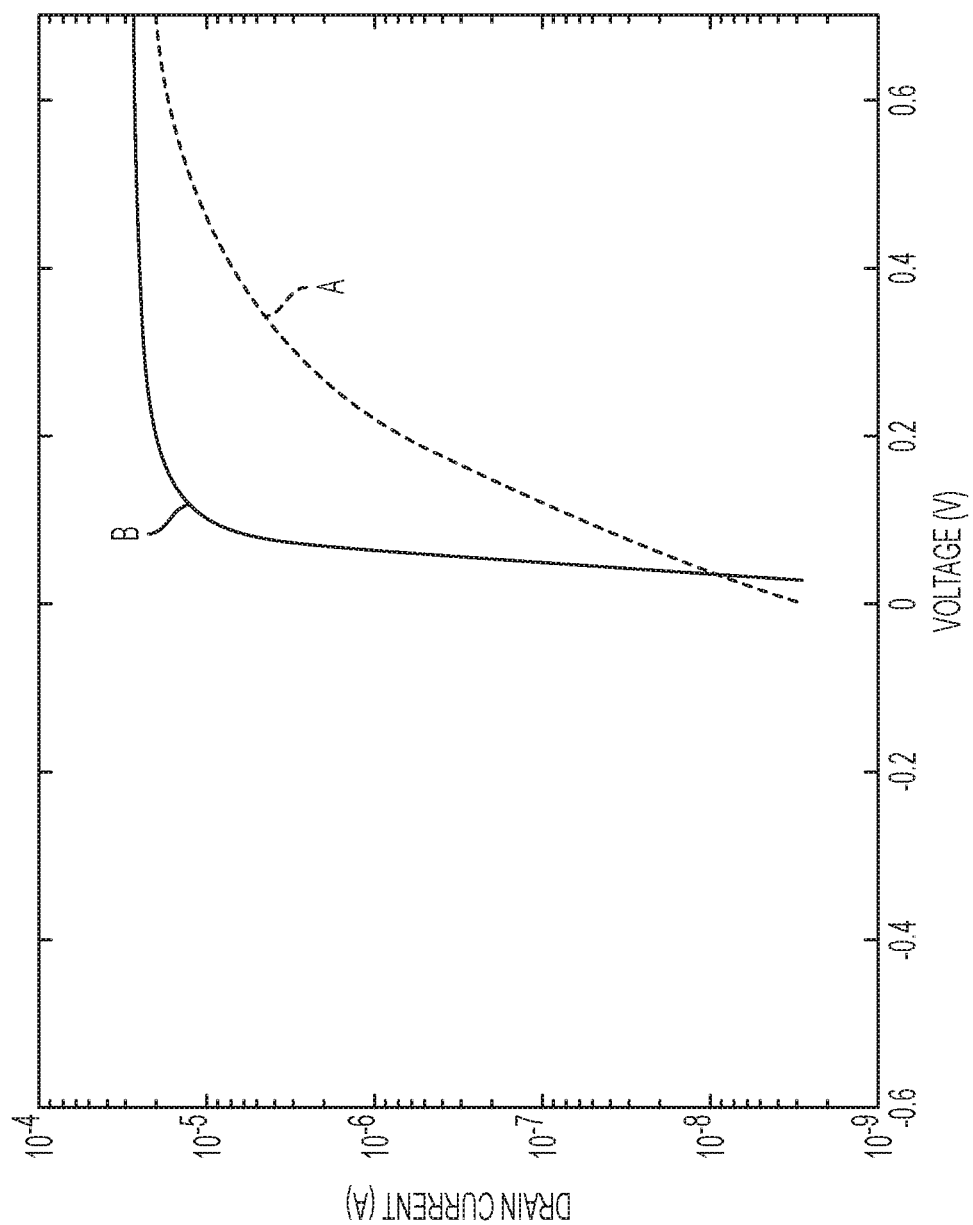
FIG. 1 is a plot of drain current versus applied voltage for a conventional FET and a negative capacitance FET.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a gain-enhanced field effect transistor (FET). The structure of an exemplary gain-enhanced FET includes a layer of ferroelectric material within the gate contact architecture laterally displaced from the device active area. The active area is a portion of the substrate in or on which the operational electrical components of the device are formed. The ferroelectric layer provides a region of negative capacitance, such that an increase in the applied voltage to the device during operation decreases the stored charge. This negative capacitance (NC) provides a mechanism for amplifying surface potential. In certain embodiments, during operation, the ferroelectric layer is configured to create a step-up transformer that amplifies the electrical charge at the gate and beneficially causes the transistor to switch on at lower applied voltages. In various embodiments, the ferroelectric layer is integrated between the gate contact, i.e., outside of the transistor active area, to create a floating electrode that is capacitively coupled to the gate via the ferroelectric.

The proposed methods and structures enable flexible tuning of the area of a bottom electrode formed below the ferroelectric layer, which allows matching of the ferroelectric capacitance to the gate capacitance, i.e., the gate dielectric-to-channel capacitance.

The impact of the ferroelectric layer on the operational characteristics of a comparative device and an exemplary negative capacitance device is shown in FIG. 1, which is a plot of drain current versus applied voltage for a baseline FET (curve A) and a negative capacitance (NC) FET (curve B) that includes a 5 nm thick ferroelectric layer within the gate contact architecture. Illustrative of the benefit of the ferroelectric layer, the sub-threshold swing for the comparative device is 88 mV/decade, while the sub-threshold swing for the exemplary device is 14.4 mV/decade.

Figure 2:
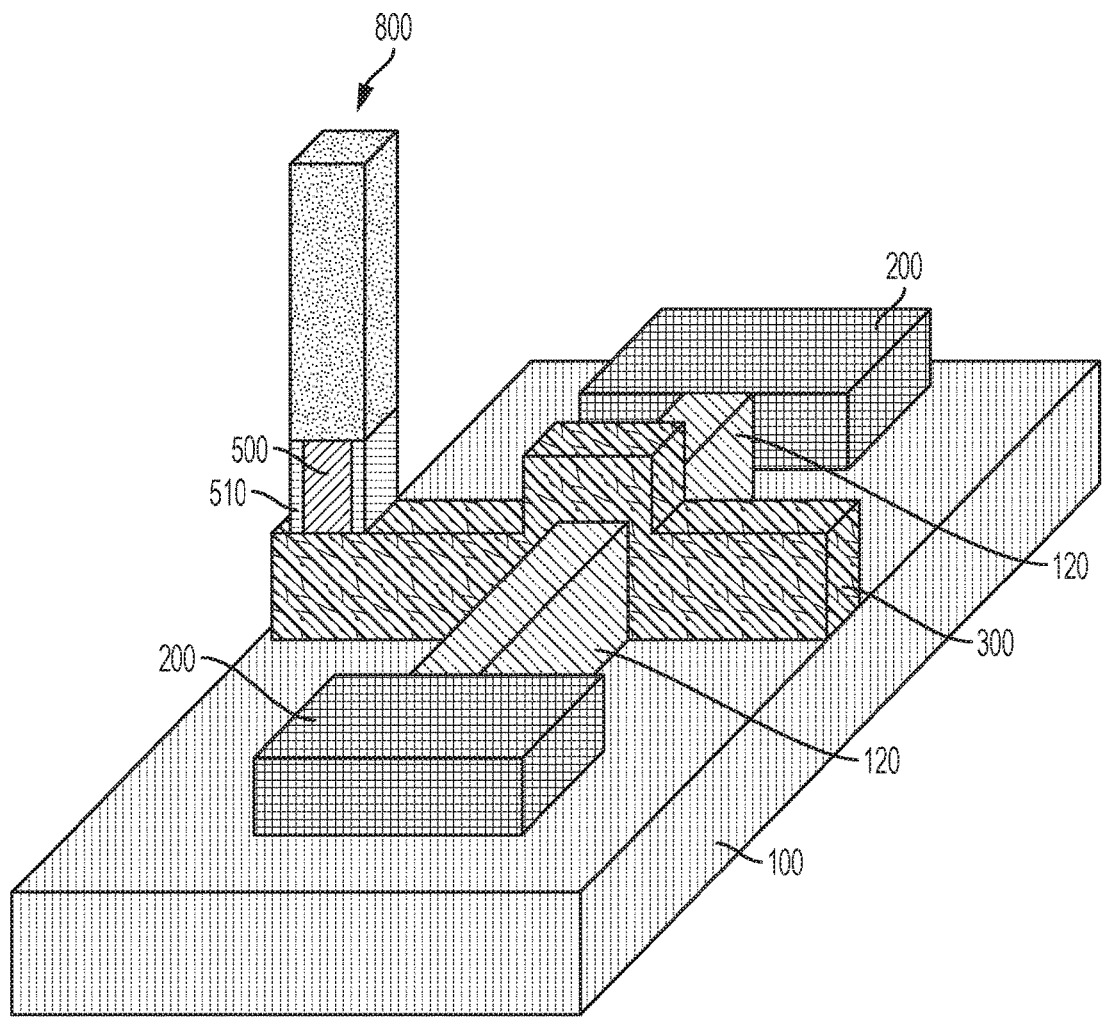
FIG. 2 is a perspective schematic diagram of a FinFET device including a gate straddling a semiconductor fin between source/drain regions and a gate contact disposed over the gate and laterally-displaced from the fin with a layer of ferroelectric material disposed between the gate contact and the gate.

Referring to FIG. 2, the structure of an exemplary FinFET device is shown in a simplified perspective schematic. The device, which is formed over a semiconductor substrate 100, which may be a bulk substrate or a composite substrate such as a semiconductor-on-insulator (SOI) substrate, includes fin 120 having source/drain regions 200 formed at opposing ends thereof, and a gate 300 straddling the fin between the source/drain regions 200. As will be appreciated by those skilled in the art, the gate 300 may include one or more gate dielectric layers and one or more gate conductor layers (not separately shown). A gate contact 800 is disposed over the gate 300 and is laterally-displaced from the fin 120, i.e., outside the active area of the device. A layer of ferroelectric material 500 is disposed between the gate contact 800 and the gate 300. As disclosed further herein, by locating the ferroelectric layer 500 outside of the device active area, i.e., laterally displaced from the fin 120, the geometry and hence the capacitance of the ferroelectric layer 500 can be controlled, which enables efficient matching of the capacitance of the ferroelectric layer to the capacitance of the gate. According to various embodiments, a top and/or bottom electrode may be formed proximate to the ferroelectric layer to define the capacitance of the ferroelectric layer.

The realization of improvements in device performance associated with the negative capacitance effect are each a function of good capacitance matching. Those skilled in the art will appreciate that the gate capacitance is largely defined by the design rules for the device, and that in accordance with various embodiments, the capacitance of the ferroelectric layer may be tuned to achieve a desired capacitance match. As will be appreciated, one or more of the composition of the ferroelectric layer, the thickness of the ferroelectric layer, and the areal dimensions of an electrode proximate to the ferroelectric layer can be adjusted to control the ferroelectric capacitance. Capacitance matching is challenging due to the high dielectric constant of the ferroelectric layer, and the implementation of thin ferroelectric layers due to design constraints at advanced nodes.

Figure 3:
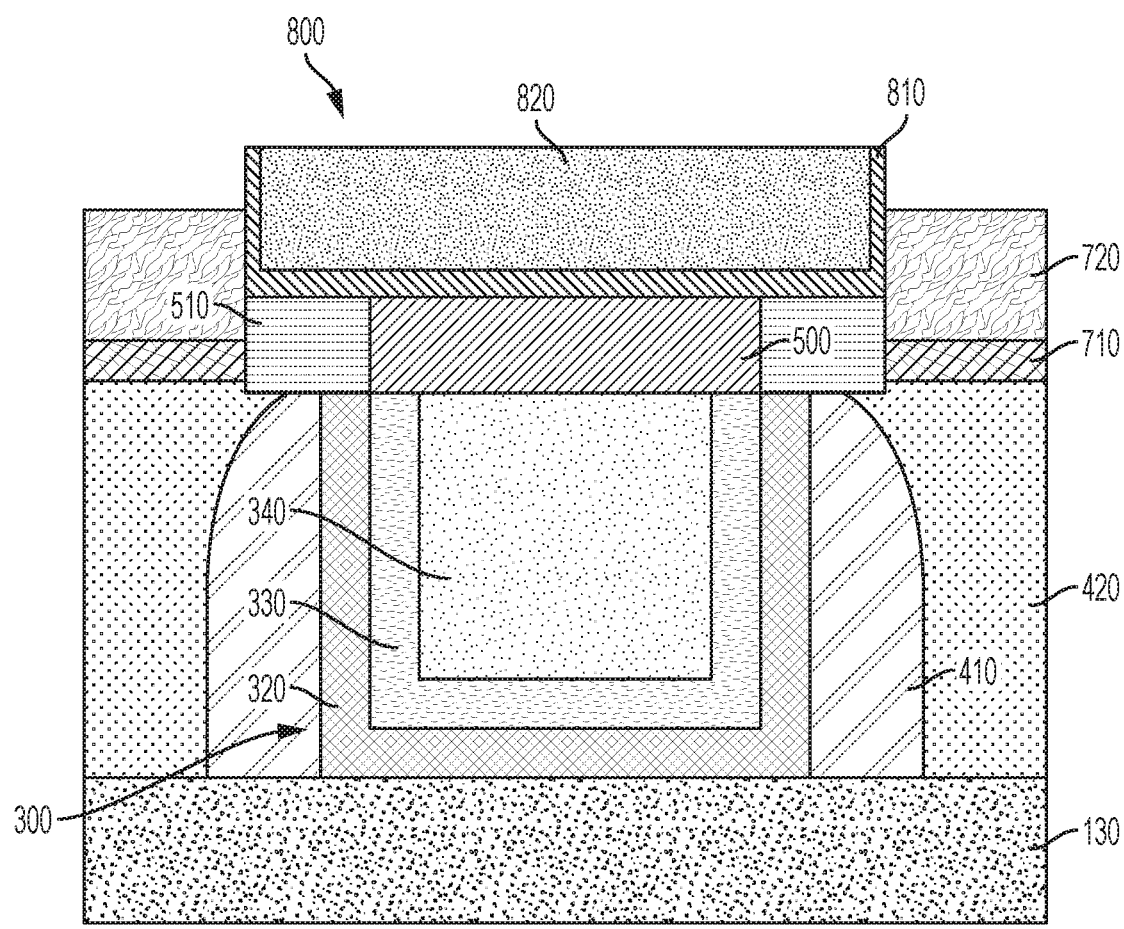
FIG. 3 is a cross-sectional diagram of a portion of a FinFET device showing a replacement metal gate (RMG) architecture outside of the device active area with a gate contact formed over a gate conductor and a ferroelectric layer disposed between the gate contact and the gate conductor.

Referring to FIG. 3, shown is a cross-sectional diagram of the gate contact architecture of an exemplary FinFET device. The structure includes a gate 300, including a gate dielectric 320, gate conductor 330, and conductive fill layer 340 formed over shallow trench isolation (STI) layer 130 within a non-active area of the device. Sidewall spacers 410 are disposed over sidewalls of the gate 300, which may include a replacement metal gate (RMG) architecture, and an interlayer dielectric 420 is formed over the sidewall spacers and over the STI layer 130. The sidewall spacers 410 may include silicon nitride, for example.

A gate contact 800, which includes a conductive liner 810 and a conductive fill layer 820, is disposed over the gate 300 and is separated from the gate 300 by ferroelectric layer 500. Conductive liner 810 may include one or more layers (not separately shown), including a layer of titanium and an overlying layer of titanium nitride, for example. Conductive fill layer 820 may include, for example, tungsten, cobalt or ruthenium, although other conductive materials may be used. In the illustrated structure, dielectric spacers 510 are formed over sidewalls of the ferroelectric layer 500 to define the areal dimensions of the ferroelectric layer 500 and therefore its capacitance. Dielectric layers 710, 720, which may respectively include a nitride layer and an oxide layer, are formed over ILD 420. The gate contact 800, the ferroelectric layer 500 and the dielectric spacers 510 are disposed within a trench formed in dielectric layers 710, 720. Dielectric spacers 510 may be formed from a nitride such as silicon nitride, or a low-k material. As used herein, a low-k material has a dielectric constant less than that of silicon dioxide. A high-k material has a dielectric constant great than that of silicon dioxide. In accordance with certain embodiments, and as illustrated in FIG. 3, ferroelectric layer 500 is formed directly over conductive fill layer 340.

Methods of forming negative capacitance devices, including the structure of FIG. 3, are described herein with reference to FIGS. 4-12, which depict simplified cross-sectional views of a gate contact architecture at various stages of manufacture in accordance with various embodiments. The gate contact architecture may be formed within a trench or via that extends through one or more dielectric layers, e.g., nitride layer 710 and/or oxide layer 720 to expose a top surface of conductive fill layer 340 in a non-active area of the device. Areal dimensions of the trench (or via) may independently range from 20 to 100 nm, e.g., 20, 30, 40, 50 or 100 nm, including ranges between any of the foregoing values. In certain embodiments, the trench height (h) may range from 40 to 200 nm, e.g., 40, 50, 100, 150, or 200 nm, including ranges between any of the foregoing values.

Figure 4:
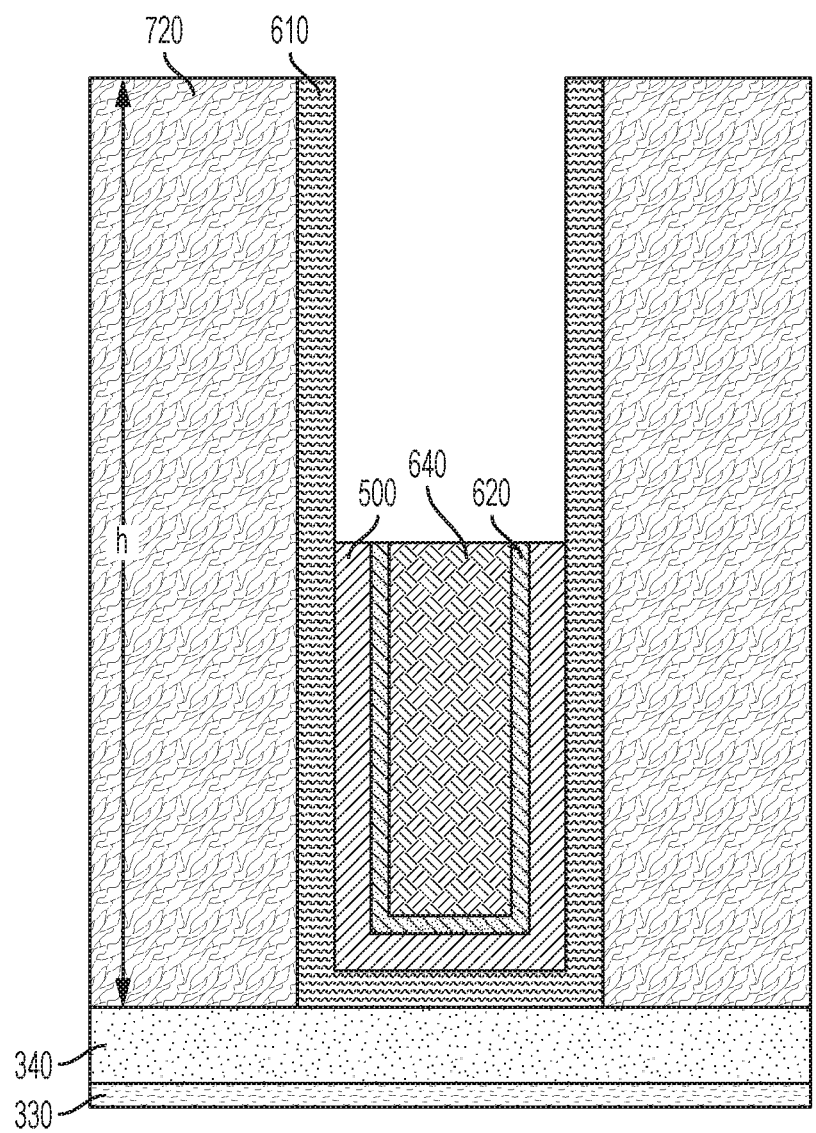
FIG. 4 is a cross-sectional view of a contact metallization structure disposed over a replacement metal gate (RMG) architecture outside of the device active area following the successive formation of a first electrode, a ferroelectric layer, a second electrode and a conductive fill layer within a trench and a recess etch of the ferroelectric layer, the second electrode and the conductive fill layer.

Referring to FIG. 4, a sequence of deposition steps are used to form a stack of layers within a trench over a non-active area of a device. In the various embodiments described herein, conventional deposition processes such as chemical vapor deposition (CVD), physical vapor deposition (PVD), atomic layer deposition (ALD), or plasma-enhanced versions of such processes may be used to form the layers.

In FIG. 4, the stack of layers includes a first electrode 610, a ferroelectric layer 500, a second electrode 620 and a conductive fill layer 640. The first electrode 610, ferroelectric layer 500, and second electrode 620 may be conformally deposited using, for example, atomic layer deposition. Example materials to form the electrodes 610, 620 may include titanium nitride or tantalum nitride. Example ferroelectric materials for the ferroelectric layer 500 include lead zirconate titanate (PZT), barium titanate, and barium strontium titanate (BST), although further ferroelectric materials are contemplated. Materials for the ferroelectric layer may be crystalline or partially-crystalline.

A thickness of the electrodes 610, 620 may independently range 2 to 10 nm, e.g., 2, 4, 6, 8 or 10 nm, including ranges between any of the foregoing values, and a thickness of the ferroelectric layer may range from 1 to 10 nm, e.g., 1, 2, 4, 6, 8 or 10 nm, including ranges between any of the foregoing values.

A recess etch is used to remove upper portions of the conductive fill layer 640, second electrode 620, and ferroelectric layer 500 from within the trench. Then, referring to FIG. 5, a further selective etch of the first and second electrodes 610, 620 is used to form recessed regions that are backfilled with an isolation dielectric. First isolation dielectric layer 631 is deposited within a recessed region over the first electrode 610 between peripheral dielectric layer(s) and the ferroelectric layer 500, and second isolation dielectric layer 632 is deposited within a recessed region over the second electrode 620 between the ferroelectric layer 500 and the conductive fill layer 640. First and second isolation dielectric layers 631, 632 may include silicon nitride.

As will be appreciated by those skilled in the art, the capacitance of the ferroelectric layer 500 is defined by the thickness (t) of the ferroelectric layer, while the area of the negative capacitor is defined by the total surface area of the first electrode 610. In various embodiments, the extent of the recess etch of the first electrode 610 can be used to control the capacitance. A larger capacitance can be obtained by decreasing the amount of the recess etch (thereby effectively increasing the total area) of the first electrode 610, where the capacitance (C) is equal to the product of the dielectric constant (E) of the ferroelectric material and the area (A) of the capacitor electrode divided by the thickness (d) of the ferroelectric layer.

Figure 5:
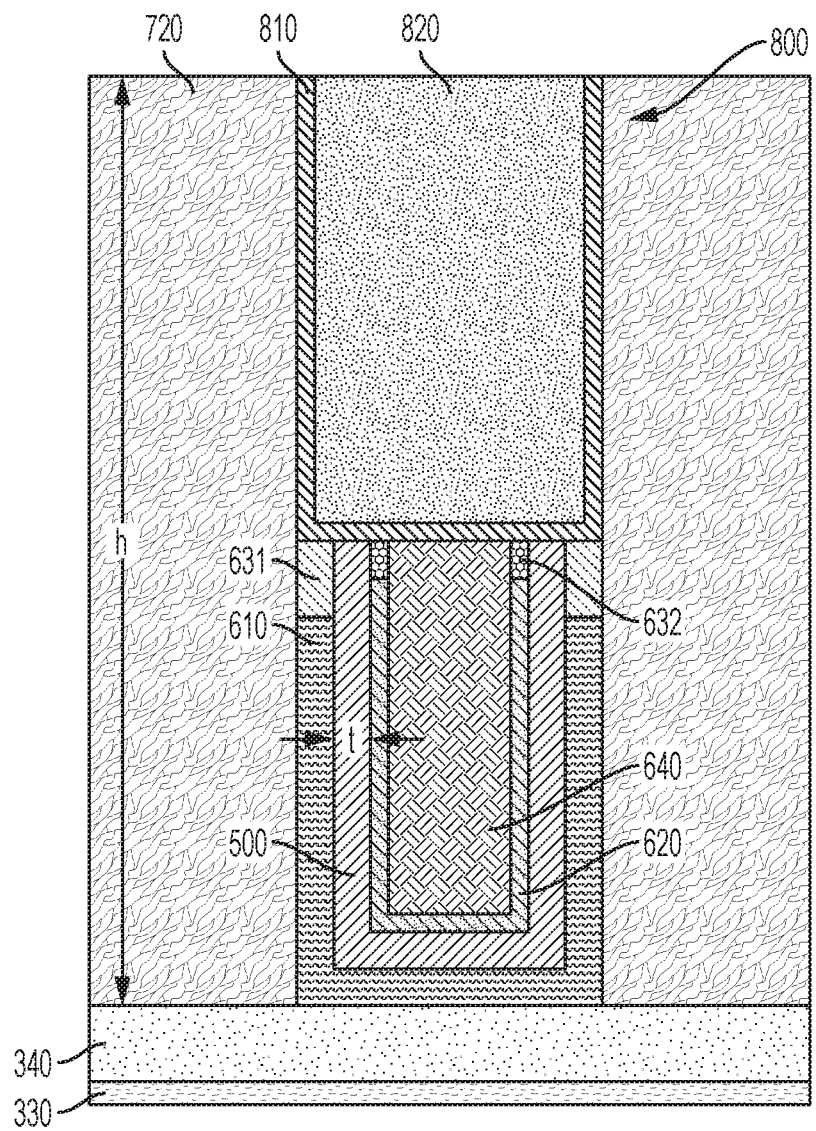
FIG. 5 is a cross-sectional view of the contact metallization structure of FIG. 4 following a selective recess etch of the first and second electrodes, the formation of a dielectric layer within the recesses, and the formation of a gate contact over the ferroelectric layer.

Referring still to FIG. 5, a gate contact 800 including a conformal conductive liner 810 and a conductive fill layer 820 is formed within the trench and over exposed surfaces of the first dielectric layer 631, second dielectric layer 632, ferroelectric layer 500 and conductive fill layer 640. First dielectric layer 631 is adapted to electrically isolate the gate contact 800 from the first electrode 610 and the underlying conductive fill layer 340.

Figure 6:
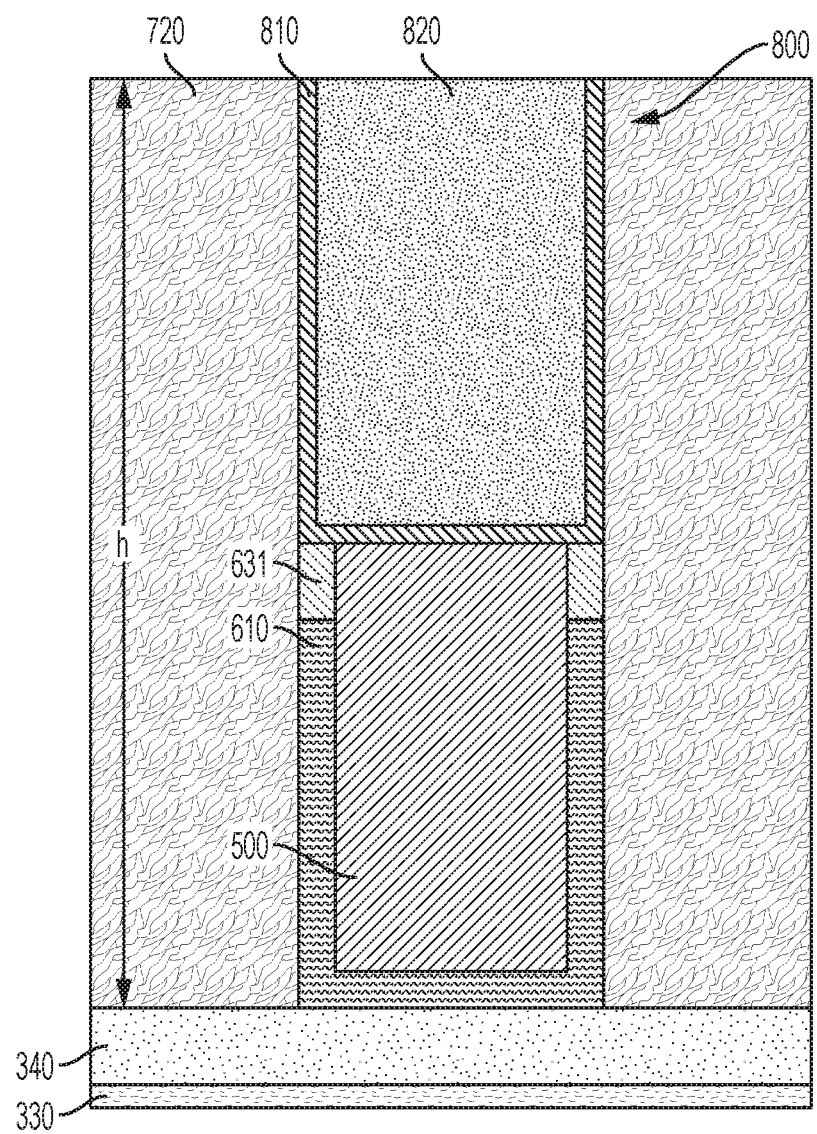
FIG. 6 is a cross-sectional view of a contact metallization structure according to an alternate embodiment, including a ferroelectric layer disposed between the gate contact and a replacement metal gate (RMG) outside of the device active area.

Referring to FIG. 6, an alternate embodiment shows the conformal deposition of the first electrode 610 within the trench, and the subsequent deposition of ferroelectric layer 500 to fill the remaining portion of the trench. After recessing the first electrode 610 and the ferroelectric layer 500 within the trench, further recessing the first electrode 610 to form a recess, and backfilling the recess with an isolation dielectric 631, a gate contact 800, including a conformal conductive liner 810 and a conductive fill layer 820, is formed within upper portions of the trench over the ferroelectric layer 500. The first electrode wraps around the sidewalls of the inlaid ferroelectric layer 500, and the gate contact 800 is separated from the first electrode 610 and hence the gate conductive fill layer 340 by the ferroelectric layer 500 and the isolation dielectric 631.

Figure 7:
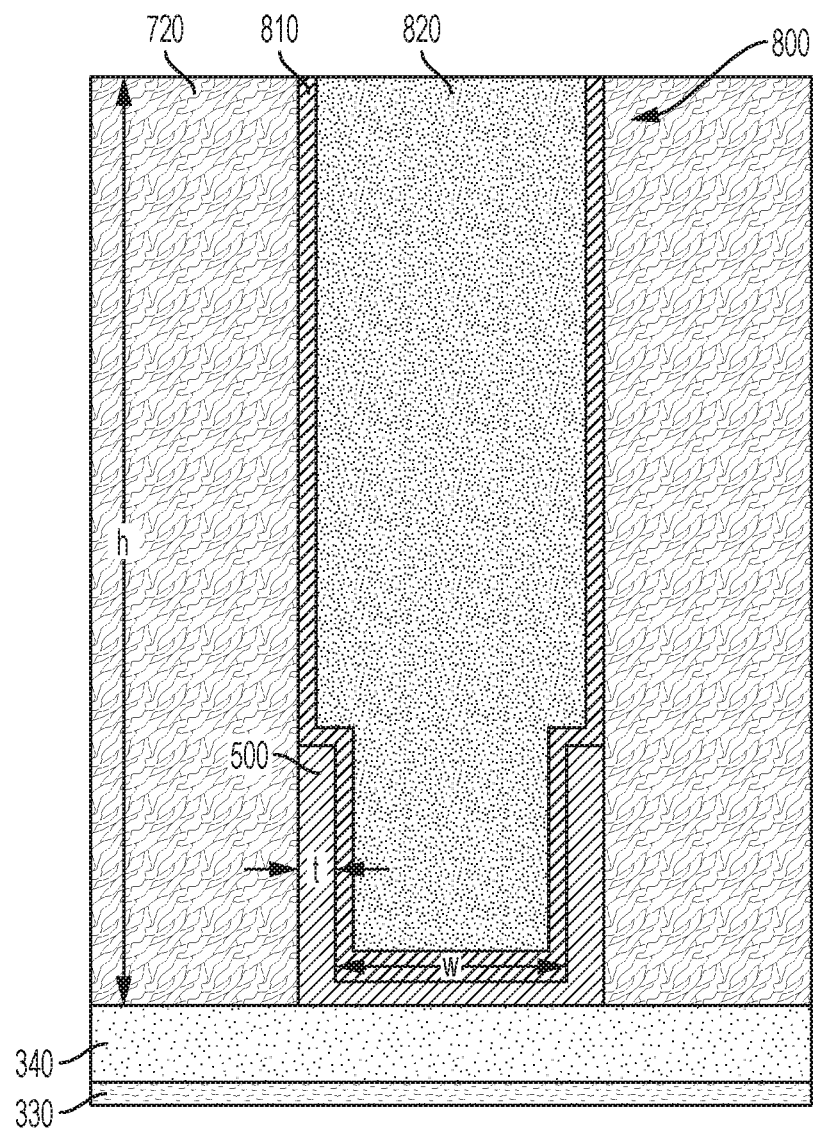
FIG. 7 is a cross-sectional view of a contact metallization structure having a ferroelectric layer disposed between a gate contact and a replacement metal gate (RMG) according to further embodiments.

Referring to FIG. 7, according to a further embodiment, a ferroelectric layer is deposited within the contact trench, and then a recess etch, optionally in conjunction with a masking layer (not shown), is used to remove portions of the ferroelectric layer laterally displaced from the sidewalls of the trench to form conformal ferroelectric layer 500. The masking layer may include an organic planarizing layer (OPL), for example. That is, the conformal ferroelectric layer 500 may be formed using an initial blanket deposition of ferroelectric material into the trench, followed by patterned removal of ferroelectric material away from the trench sidewalls. In the embodiment of FIG. 7, the ferroelectric layer 500 is deposited directly on conductive fill layer 340. A gate contact 800, including a conformal conductive liner 810 and a conductive fill layer 820, is then formed over the ferroelectric layer 500 to fill the trench. One or more CMP steps may be used to remove the overburden of the deposited layers.

The capacitance of the ferroelectric layer 500 shown in FIG. 7 is defined by the thickness (t) of the ferroelectric layer 500. The area of the negative capacitor is defined by the surface area (A=length×width) of the first electrode 610 proximate to the conductive fill layer 340. The width (w) is of the first electrode 610 is shown.

Figure 8:
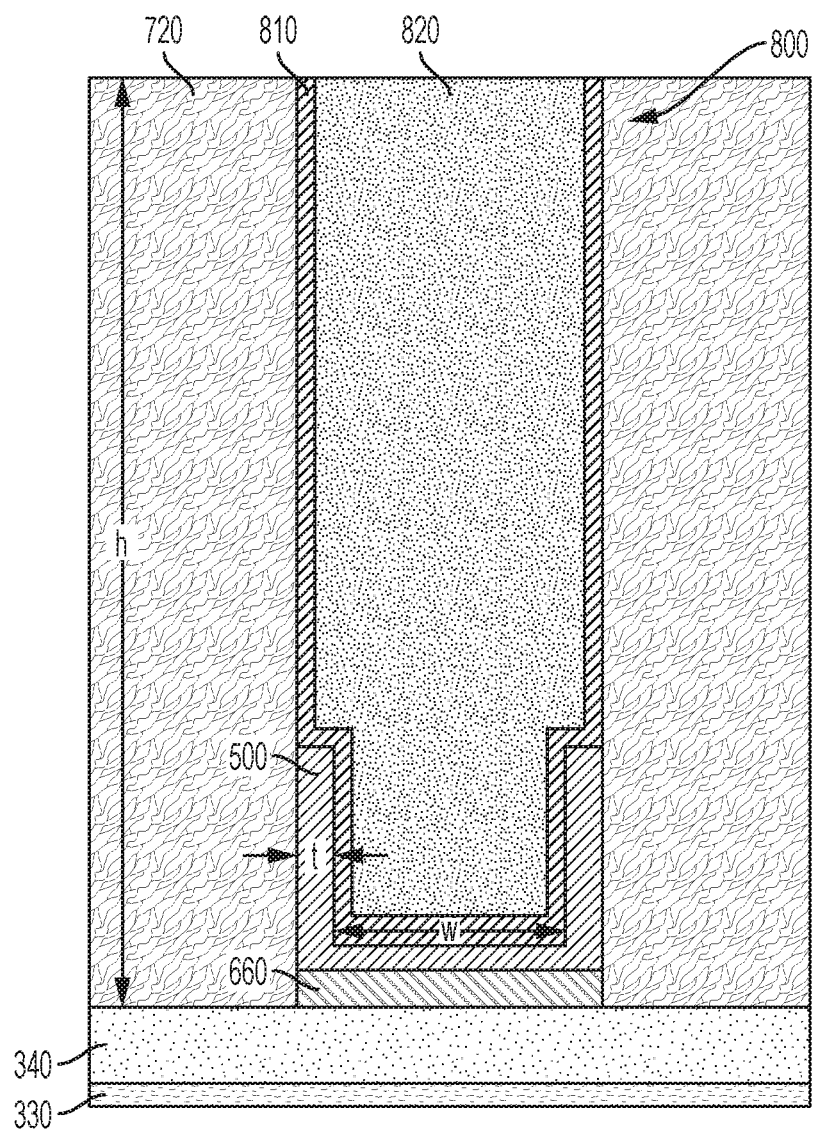
FIG. 8 is a cross-sectional view of a contact metallization structure having a ferroelectric layer disposed between a gate contact and a replacement metal gate (RMG) and further including a template layer between the ferroelectric layer and the conductive fill layer of the RMG.

Referring to FIG. 8, shown is a structure similar to that described in connection with FIG. 7, except prior to deposition of the ferroelectric layer 500, a template layer 660 is formed over the bottom surface of the trench, i.e., over the conductive fill layer 340, such that the ferroelectric layer 500 is deposited directly over sidewalls of the trench and directly over the template layer 660. The template layer 660 is adapted to promote crystallization and growth of grains within the ferroelectric layer, e.g., during a post-deposition anneal. Example template layer materials include titanium nitride and tantalum nitride, which may be deposited by atomic layer deposition (ALD). The template layer 660 may include a conductive, crystalline material having an average grain size of 10 nm or less, e.g., 2, 4, 6 or 10 nm, including ranges between any of the foregoing values.

In conjunction with the various embodiments disclosed herein, after deposition of the ferroelectric layer 500, a recrystallization anneal may be used to modify the morphology of the ferroelectric layer through a solid state phase transformation that results in the formation of a ferroelectric phase. The recrystallization anneal may be performed in conjunction with a ferroelectric layer deposited directly over a template layer 660 or directly over the conductive fill layer 340.

Figure 9:
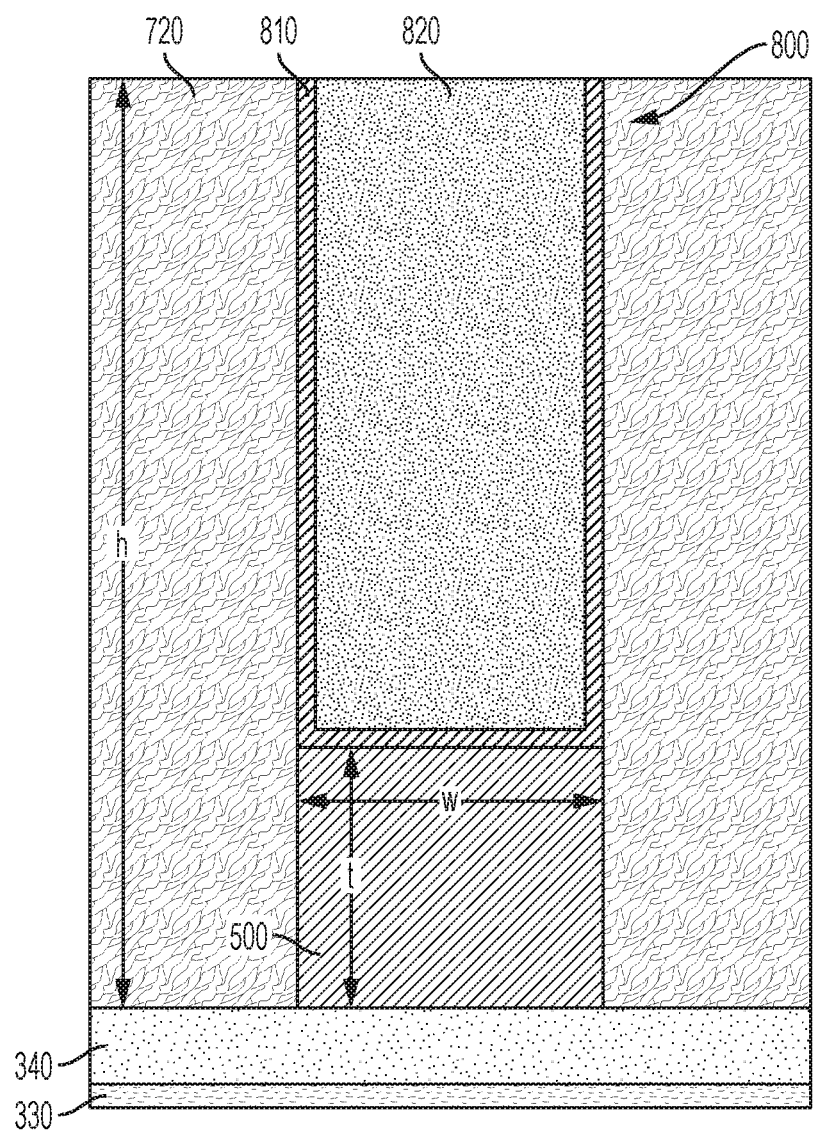
FIG. 9 is a cross-sectional view of a contact metallization structure having a ferroelectric layer disposed between the gate contact and the replacement metal gate (RMG) conductive fill layer according to still further embodiments.

Referring to FIG. 9, an alternate embodiment shows the deposition of a non-conformal ferroelectric layer 500 within the trench and directly over the conductive fill layer 340. Following a recess etch of the ferroelectric layer, a conformal conductive liner 810 and a conductive fill layer 820, are successively formed within upper portions of the trench over the ferroelectric layer 500.

In the embodiment of FIG. 9, the capacitance of the ferroelectric layer 500 is defined by the thickness (t) of the ferroelectric layer 500. The area of the negative capacitor is defined by the surface area (A=length×width) of the gate contact 800 proximate to the conductive fill layer 340. The width (w) is of the gate contact 800 is shown.

Figure 10:
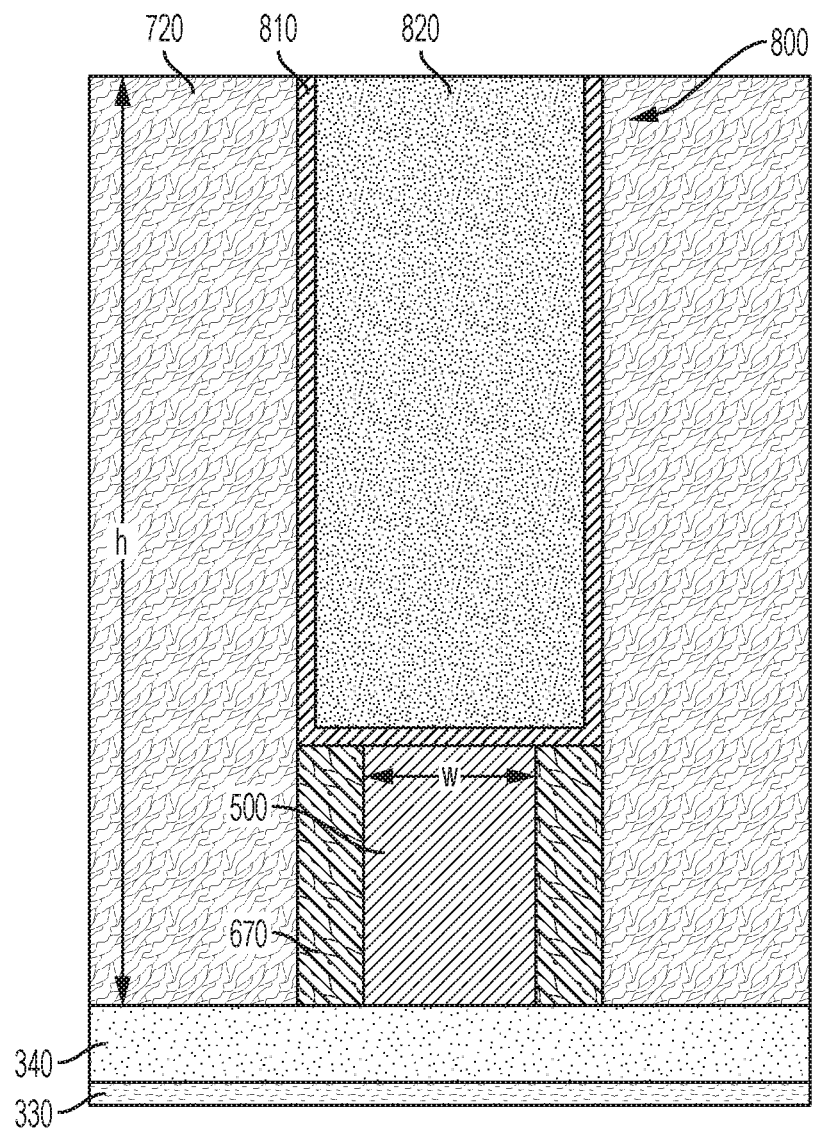
FIG. 10 is a cross-sectional view of a contact metallization structure having a ferroelectric layer with sidewall spacers disposed outside of the device active area between the gate contact and the replacement metal gate (RMG)

Referring to FIG. 10, shown is a cross-sectional view of a contact metallization structure having a ferroelectric layer 500 with a sidewall spacer 670 disposed outside of the device active area between the gate contact 800 and the conductive fill layer 340 of the replacement metal gate. Sidewall spacer 670 may be formed over lower sidewalls of the trench. Sidewall spacer 670 can be used to control the cross-sectional area of the ferroelectric layer within the trench. For instance, in contrast to the structure of FIG. 9, where the width (w) of the capacitor electrode is essentially equal to the width of the trench, in the embodiment of FIG. 10, sidewall spacer 670 may be used to tailor the areal dimensions of the capacitor notwithstanding the areal dimensions of the trench.

The structure of FIG. 10 may be formed by depositing a spacer layer within the trench and then depositing a ferroelectric layer over the spacer layer. The sidewall spacer 670 may include silicon dioxide, silicon nitride, or another dielectric material, such as a high dielectric constant (high-k) material (e.g., hafnium oxide). The sidewall spacer may be deposited by a suitable process such as atomic layer deposition (ALD), chemical vapor deposition (CVD), physical vapor deposition (PVD), thermal oxidation, UV-ozone oxidation, or combinations thereof.

As used herein, the compounds silicon nitride and silicon dioxide have compositions that are nominally represented as $Si_3N_4$ and $SiO_2$, respectively. The terms silicon nitride and silicon dioxide, refer to not only these stoichiometric compositions, but also to nitride and oxide compositions that deviate from the stoichiometric compositions.

In various embodiments, formation of the sidewall spacer 670 includes a conformal deposition process such as chemical vapor deposition (CVD), followed by an anisotropic etch to remove portions of the spacer material(s) from horizontal surfaces. In various embodiments, the thickness of the sidewall spacer 670 may range from 5 nm to 20 nm, although lesser and greater thicknesses can be used.

A layer of ferroelectric material may be deposited within the trench, i.e., directly over the spacer layer and over the conductive fill layer 340. A non-selective etch such as a wet etch may be used to recess the ferroelectric and spacer layer within the trench. Then, as illustrated in FIG. 10, a gate contact 800, including a conformal conductive liner 810 and a conductive fill layer 820, is formed over the recessed ferroelectric layer 500 to fill the trench.

Figure 11:
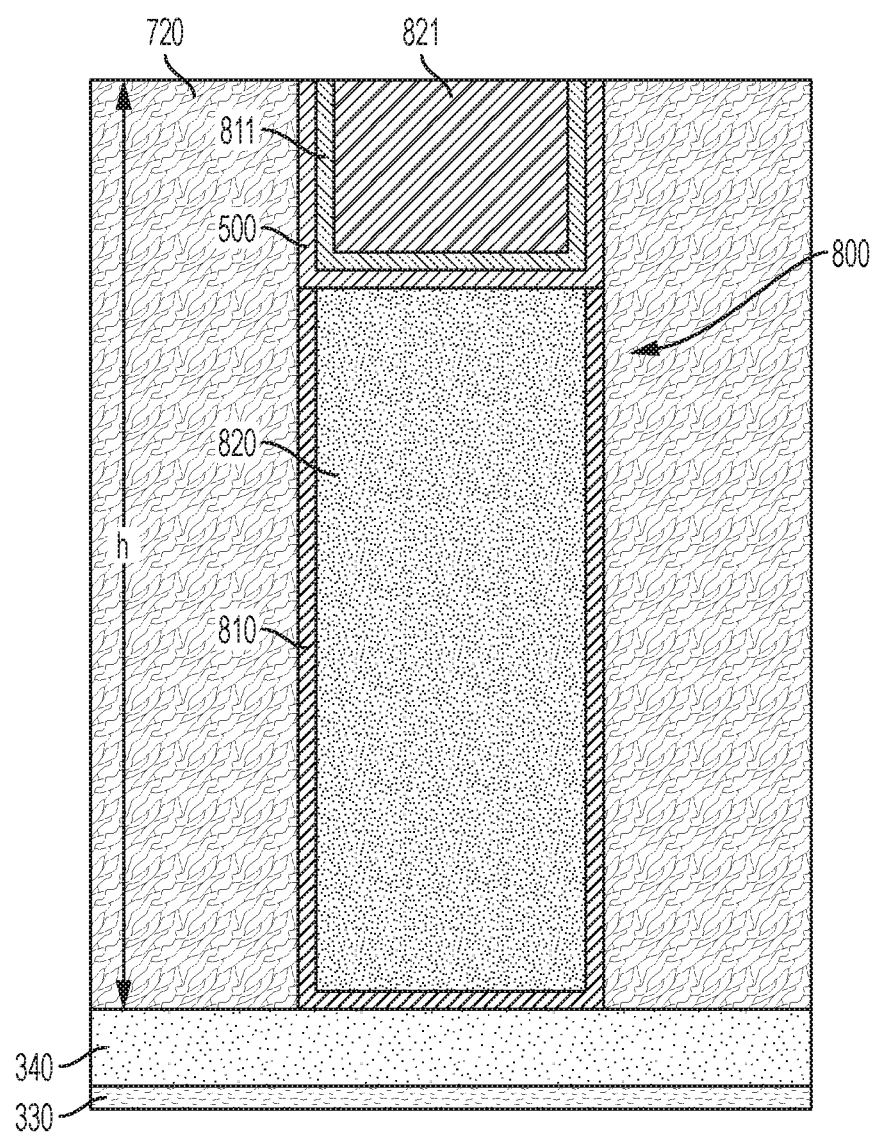
FIG. 11 is a cross-sectional view of a contact metallization structure having a ferroelectric layer disposed between upper and lower gate contacts and over the replacement metal gate (RMG)

A further contact metallization structure is shown in FIG. 11. The structure of FIG. 11 includes a ferroelectric layer 500 disposed between upper and lower gate contacts and over the conductive fill layer 340 of the replacement metal gate.

Referring to FIG. 11, a conventional gate contact 800, including a conformal conductive liner 810 and a conductive fill layer 820, is formed within a trench and over the conductive fill layer 340 of a replacement metal gate outside of the active area of a device. Following a recess etch of the gate contact layers, a conformal ferroelectric layer 500 is formed within the trench, i.e., directly over exposed surfaces of the conductive liner 810 and the conductive fill layer 820. A further conductive liner 811 and conductive fill layer 821 are deposited over the ferroelectric layer to fill the trench. A chemical mechanical polishing step may be used to remove portions of the deposited layers outside of the trench and planarize the structure.

Figure 12:
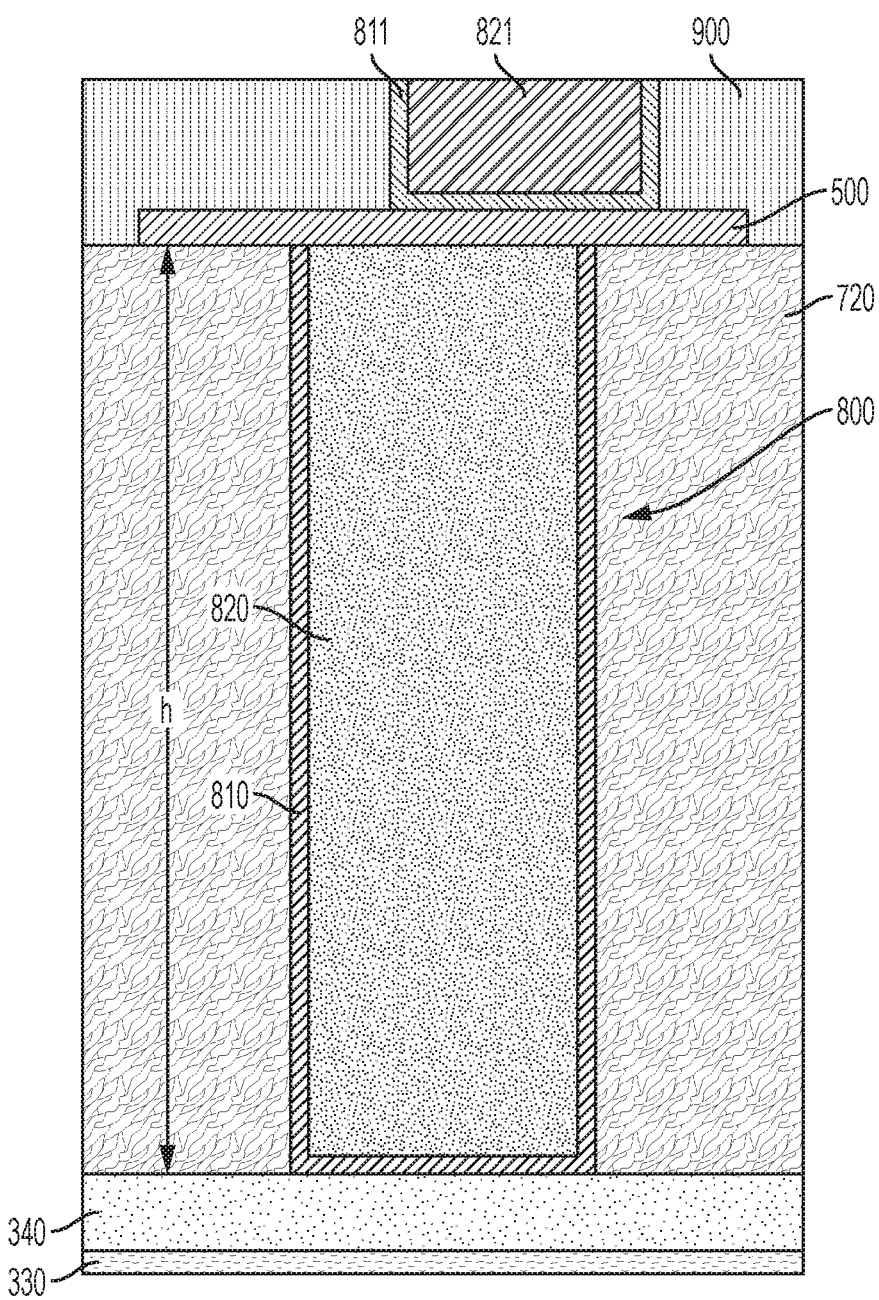
FIG. 12 is a cross-sectional view of a contact metallization structure having a ferroelectric layer disposed over the gate contact and over the replacement metal gate (RMG)

A further embodiment, similar to the structure of FIG. 11, is shown in FIG. 12. In the illustrated structure, a gate contact 800 including a conformal conductive liner 810 and a conductive fill layer 820 is formed within a trench and over the conductive fill layer 340 of a replacement metal gate. Following a CMP step to remove the overburden, a ferroelectric layer 500 is deposited over a top surface of the conductive fill layer 820, and over a top surface of the dielectric layer(s) that defines the trench, e.g., without a recess etch of the gate contact 800. Thereafter, a dielectric layer 900, such as a low-k dielectric layer, is deposited over the structure. The dielectric layer 900 is patterned and etched to form an opening exposing the ferroelectric layer 500, and a top metallization layer including a conductive liner 811 and conductive fill layer 821, are deposited over the ferroelectric layer to fill the opening. According to various embodiments, conductive fill layer 821 may include tungsten (W) or another conductive material such as copper (Cu), including compounds and alloys thereof, which may be deposited during a back end of the line (BEOL) process. The negative capacitance is defined by the thickness of the ferroelectric layer 500 and the overlap area between the top metallization layer and the gate contact 800.

In various embodiments, the incorporation of negative capacitance into a FinFET gate contact decreases the sub-threshold slope, which enables low power operation and decreased self-heating. The ferroelectric layer is incorporated outside of the active area of the device, e.g., between the gate contact and the gate. Embodiments of the disclosed negative capacitance structures are not limited to FinFETs. The flexibility of capacitive tuning associated with incorporating the ferroelectric within the gate contact structure allows the present approach to be implemented with other device structures, include nanowire and nanosheet transistors, gate-all-around transistors, and nanotube transistors, for example.

Figure 13:
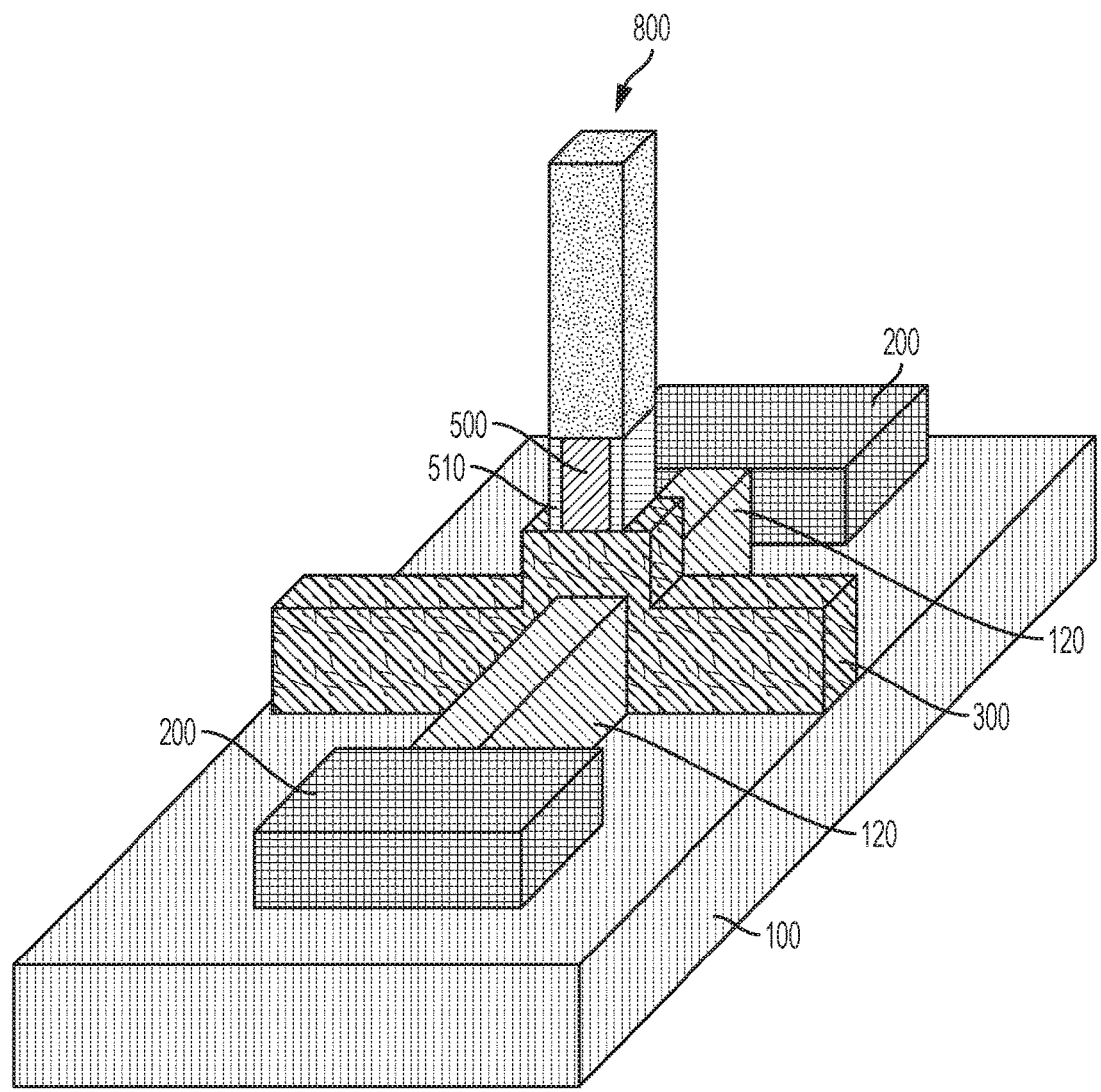
FIG. 13 is a perspective schematic diagram of a FinFET device including a gate straddling a semiconductor fin between source/drain regions and a gate contact disposed over the gate and over the fin with a layer of ferroelectric material disposed between the gate contact and the gate.

According to further embodiments, the gate contact may be located within the device active area, such as over a semiconductor fin or between adjacent fins within a multi-fin architecture. By way of example, is a perspective schematic diagram of a FinFET device including a gate 300 straddling a semiconductor fin 120 between source/drain regions 200 is shown in FIG. 13. A gate contact 800 is disposed over the gate 300 and as well as over the fin 120, i.e., within the active area of the device. A layer of ferroelectric material 500 is disposed between the gate contact 800 and the gate 300. As will be appreciated, a gate contact disposed within the device active area may fully or partially overlie a semiconductor fin, or may be located at least partially between fins.

As used herein, the singular forms "a," "an" and "the" include plural referents unless the context clearly dictates otherwise. Thus, for example, reference to a "gate dielectric layer" includes examples having two or more such "gate dielectric layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a ferroelectric layer that comprises lead zirconate titanate include embodiments where a ferroelectric layer consists essentially of lead zirconate titanate and embodiments where a ferroelectric layer consists of lead zirconate titanate.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A semiconductor device, comprising:
    a gate disposed over an active area of a semiconductor substrate and extending laterally over the semiconductor substrate outside of the active area;
    a gate contact disposed over the gate outside of the active area;
    a ferroelectric layer disposed between the gate contact and the gate outside of the active area; and
    a template layer disposed over the gate outside of the active area, wherein the ferroelectric layer is disposed directly over the template layer, wherein the template layer comprises a crystalline material having an average grain size of less than 10 nm.

2. The device of claim 1, wherein the gate comprises a gate dielectric and a gate conductor disposed over the gate dielectric, and the ferroelectric layer is disposed directly over the gate conductor.

3. The device of claim 2, wherein the gate conductor comprises tungsten.

4. The device of claim 1, wherein the template layer comprises titanium nitride or tantalum nitride.

5. The device of claim 1, wherein the template layer is adapted to promote crystallization and growth of grains within the ferroelectric layer.

6. The device of claim 1, further comprising a dielectric layer disposed over the gate, wherein the gate contact is disposed within a trench that extends through the dielectric layer.

7. The device of claim 6, further comprising a conformal first electrode disposed over sidewalls of the trench and directly over a gate at a bottom of the trench.

8. The device of claim 7, wherein the ferroelectric layer is disposed directly over the conformal first electrode within the trench.

9. The device of claim 7, wherein the gate contact is disposed within the trench over the ferroelectric layer and the first electrode, and further comprising an isolation dielectric disposed over sidewalls of a trench between the gate contact and the first electrode.

10. The device of claim 6, further comprising a sidewall spacer disposed over sidewalls of the trench, wherein the ferroelectric layer is disposed over the sidewall spacer between opposing sidewalls.

11. The device of claim 10, wherein the sidewall spacer comprises silicon dioxide, silicon nitride or a high-k dielectric.

12. A method of fabricating a semiconductor device, comprising:
    forming a gate over an active area of a semiconductor substrate, wherein the gate extends laterally over the semiconductor substrate outside of the active area;
    forming a template layer over the gate outside of the active area, wherein the template layer comprises a crystalline material having an average grain size of less than 10 nm;
    forming a ferroelectric layer directly over the template layer; and
    forming a gate contact over the ferroelectric layer.

13. The method of claim 12, further comprising:
    forming a dielectric layer over the gate;
    forming a trench extending through the dielectric layer outside of the active area and exposing a top surface of the gate;
    forming a first electrode over sidewalls of the trench and directly over the gate at a bottom of the trench; and
    forming the ferroelectric layer over the first electrode.

14. The method of claim 12, further comprising:
    forming a sidewall spacer over sidewalls of a trench; and
    forming the ferroelectric layer between opposing sidewalls of the sidewall spacer.

15. A semiconductor device, comprising:
    a gate disposed over an active area of a semiconductor substrate;
    a gate contact disposed over the gate;
    a dielectric layer disposed over the gate, wherein the gate contact is disposed within a trench that extends through the dielectric layer;
    a ferroelectric layer disposed between the gate contact and the gate; and
    a sidewall spacer disposed over sidewalls of the trench, wherein the ferroelectric layer is disposed over the sidewall spacer between opposing sidewalls.

16. The device of claim 15, wherein the gate extends laterally over the semiconductor substrate outside of the active area.

* * * * *